United States Patent
Du

(10) Patent No.: US 7,346,870 B2
(45) Date of Patent: Mar. 18, 2008

(54) SYSTEM AND METHOD FOR VERIFYING TRACE WIDTHS OF A PCB LAYOUT

(75) Inventor: Xiao-Yu Du, Shen-Zhen (CN)

(73) Assignees: Hong Fu Jin Precision Industry (Shenzhen) Co., Ltd., Shenzhen, Guangdong Province (TW); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 484 days.

(21) Appl. No.: 11/024,502

(22) Filed: Dec. 29, 2004

(65) Prior Publication Data
US 2005/0268259 A1   Dec. 1, 2005

(30) Foreign Application Priority Data
May 28, 2004   (TW) ............................. 93115277 A

(51) Int. Cl.
G06F 17/50   (2006.01)
(52) U.S. Cl. ............................................. 716/5; 716/15
(58) Field of Classification Search .................... None
See application file for complete search history.

(56) References Cited

U.S. PATENT DOCUMENTS

| 6,063,132 | A   | 5/2000  | DeCamp et al. ............. 716/5 |
| 6,665,846 | B2  | 12/2003 | Rein et al. .................. 716/5 |
| 6,799,306 | B2* | 9/2004  | Araki et al. ................. 716/4 |
| 6,865,724 | B2* | 3/2005  | Eisenberg et al. ........... 716/5 |
| 6,938,230 | B2* | 8/2005  | Frank et al. ................ 716/4 |
| 6,971,077 | B1* | 11/2005 | Frank et al. ................ 716/5 |
| 7,117,464 | B2* | 10/2006 | Frank et al. ................ 716/5 |
| 7,168,056 | B2* | 1/2007  | Dong ........................ 716/5 |
| 2004/0010766 | A1* | 1/2004 | Swope ...................... 716/15 |
| 2005/0155008 | A1* | 7/2005 | Archambeault et al. ..... 716/11 |

* cited by examiner

*Primary Examiner*—Leigh M. Garbowski
(74) *Attorney, Agent, or Firm*—Morris Manning Martin LLP; Tim Tingkang Xia, Esq.

(57) ABSTRACT

A method for verifying trace widths of a printed circuit board (PCB) layout includes the steps of: loading a PCB layout document from a database; defining a verifying area for a PCB layout specified in the PCB layout document; receiving preset design rules; creating a data structure, and loading information on traces in the verifying area into the data structure; selecting an unverified trace from the data structure; selecting an unverified segment from the selected trace; verifying the selected segment by comparing a width of the selected segment with the rules, and determining whether the selected segment satisfies the rules according to the comparison result; and annotating design rule check (DRC) information if the segment does not satisfy the rules. Other segments of the selected trace and other traces are verified by repeating appropriate of the above-described steps. A related system for implementing the method is also disclosed.

8 Claims, 3 Drawing Sheets

SYSTEM AND METHOD FOR VERIFYING TRACE WIDTHS OF A PCB LAYOUT

BACKGROUND OF THE INVENTION

1. Field of the Invention

The present invention relates to computer-enabled trace width verifying systems and methods, and particularly to a system and method for verifying trace widths of a printed circuit board (PCB) layout.

2. Background of the Invention

Computer chip sizes are continuing to be miniaturized, and electrical signals thereof are being clocked at ever increasing frequencies. Even more that previously, high-speed, high-frequency signals being driven between chips via traces on a PCB are liable to detrimental impedance effects. One manifestation of these impedance effects is unwanted reflections due to impedance mismatches. The high-speed, high-frequency signals may also be prone to cross-talk and electromagnetic interference (EMI).

EMI is an electrical disturbance in an electronics-based system. EMI can be caused by natural phenomena such as lightning, by low-frequency waves emitted from electromechanical devices such as motors, or by high-frequency waves emitted from integrated circuits and other electronic devices such as routers. In the United States, the Federal Communications Commission sets limits on the EMI output of electronic devices. Other countries set their own limits on the EMI output of electronic devices. It is therefore necessary for all parties involved in the fabrication, manufacture, and/or sale of electronic devices to comply with the limitations imposed. In particular, it is necessary for manufacturers to ensure that EMI emissions of electronic devices in use are at or below the maximums imposed in relevant jurisdictions.

Trace widths on a PCB is a parameter affecting EMI emissions. In particular, the wider the trace width is, the more intense the EMI emissions are. Therefore, when constructing a PCB layout, it is necessary to verify the trace widths to insure that the EMI emissions caused by the traces meet the requirements imposed in the relevant jurisdiction(s). Additionally, such verification should be performed before the final physical layout of the PCB is determined, in order to avoid or minimize the difficult and expensive process of rectifying failed trace widths.

Accordingly, there is a need for a system and method for verifying trace widths of a PCB layout, in which verification is fast and inexpensive, and can be performed as early as possible in the design process.

SUMMARY OF THE INVENTION

A main objective of the present invention is to provide a system and method which can efficiently verify trace widths of a PCB layout.

To accomplish the above objective, a system for verifying trace widths of a PCB layout in accordance with a preferred embodiment of the present invention comprises a database for storing information on preset design rules and PCB layout documents, and a trace width verifying apparatus. The trace width verifying apparatus is for: loading PCB layout documents; defining basic rectangles in PCB layouts; defining verifying areas for the PCB layout specified in the PCB layout document according to the basic rectangles; receiving preset design rules; verifying traces in the verifying area one by one by checking whether segment widths of each trace satisfy the preset design rules; and annotating design rule check (DRC) information if any segment width does not satisfy the preset design rules.

Further, the present invention provides a method for verifying trace widths of a PCB layout, the method comprising the steps of: loading a PCB layout document; defining a basic rectangle in a PCB layout; defining a verifying area for the PCB layout specified in the PCB layout document according to the basic rectangle; receiving preset design rules; creating a data structure, and loading information on traces in the verifying area into the data structure; selecting an unverified trace from the data structure; selecting an unverified segment from the selected trace; verifying the selected segment by comparing a width of the selected segment with the preset design rules, and determining whether the selected segment satisfies the preset design rules according to the comparison result; and annotating design rule check (DRC) information if the segment width does not satisfy the preset design rules.

Other objects, advantages and novel features of the present invention will be drawn from the following detailed description with reference to the attached drawings, in which:

DETAILED DESCRIPTION OF THE INVENTION

Figure 1:
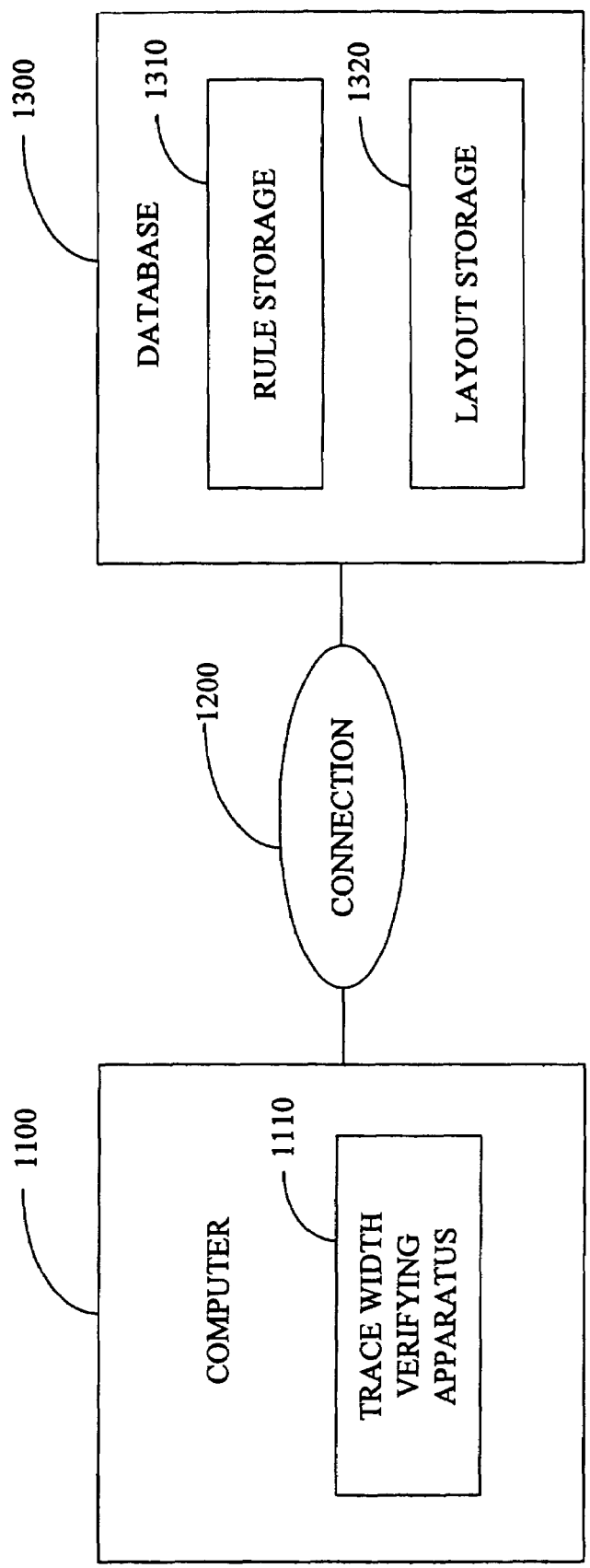
FIG. 1 is a block diagram of hardware infrastructure of a system for verifying circuit trace widths of a printed circuit board (PCB) layout in accordance with the preferred embodiment of the present invention.

FIG. 1 is a block diagram of hardware infrastructure of a system for verifying circuit trace widths of a printed circuit board (PCB) layout (hereinafter, "the system") in accordance with the preferred embodiment of the present invention. The system achieves the function of verifying trace widths by checking whether segment widths of each trace satisfy preset design rules. The preset design rules contain a preset maximum value of the trace widths (hereinafter referred to as "max-width") and a preset minimum value of the trace widths (hereinafter referred to as "min-width"). If a trace width is greater than the max-width, or less than the min-width, the system annotates Design Rule Check (DRC) information to indicate that the trace does not satisfy the preset design rules. Commonly, a trace is constituted by a plurality of segments, and segment widths of a trace may be different. Therefore, verifying trace widths can be realized by verifying the segment widths thereof.

The system comprises a computer 1100, and a database 1300 connected to the computer 1100 through a connection 1200. The connection 1200 is a database connectivity, such as an Open Database Connectivity (ODBC) or a Java Database Connectivity (JDBC). The computer 1100 comprises a trace width verifying apparatus 1110. The trace width verifying apparatus 1110 loads PCB layout documents completed by designers from the database 1300, and defines verifying areas for PCB layouts specified in the PCB layout documents. Also, the trace width verifying apparatus 1110 receives the preset design rules from the database 1300, and verifies all traces in the verifying areas one by one by checking whether the segment widths of each trace satisfy the preset design rules. Further, the trace width verifying apparatus 1110 annotates design rule check (DRC) information when any segment width does not satisfy the preset design rules. Each of the PCB layout documents contains detailed layout information, such as a layer structure of a corresponding PCB, layer names, component names, component specifications, component positions, pin names of each component, trace names, trace lengths, trace widths, segments of each trace, and the like.

The database 1300 is used for storing data used and generated by the system, and comprises two logically separated storages: a rule storage 1310, and a layout storage 1320. The rule storage 1310 is used for storing the preset design rules. The layout storage 1320 is used for storing the PCB layout documents.

Figure 2:
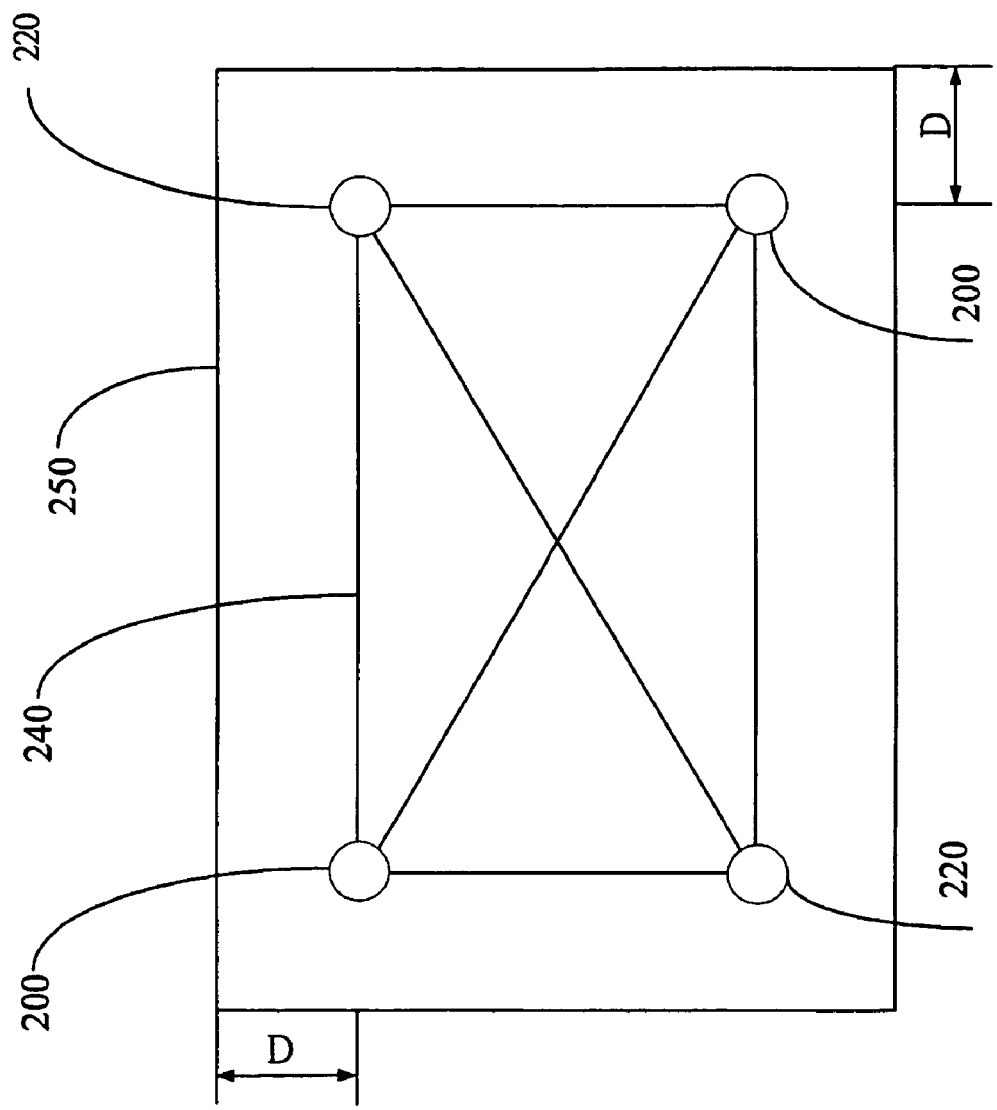
FIG. 2 illustrates an exemplary verifying area defined based on pins of a component of a PCB layout, according to the present invention.

FIG. 2 illustrates an exemplary verifying area defined by the trace width verifying apparatus 1110 based on pins of a component of a PCB layout. Generally, any two diagonal pins of the component (e.g., the pins 200) have a corresponding "crossing" pair of diagonal pins (i.e., the pins 220). The two pairs of diagonal pins 200 and 220 define a unique basic rectangle 240. When selecting a pair of diagonal pins (e.g., the pins 200), the trace width verifying apparatus 1110 searches for the corresponding crossing pair of diagonal pins (i.e., the pins 220) in order to define the basic rectangle 240. Then the trace width verifying apparatus 1110 extends the basic rectangle 240 in length and width to obtain a new larger rectangle 250, according to a preset distance D. Alternatively, the trace width verifying apparatus 1110 can define a verifying area by selecting one or more PCB layers as a verifying area according to types or names of layers of the PCB. The trace width verifying apparatus 1110 then verifies all traces in the selected layer or layers.

Figure 3:
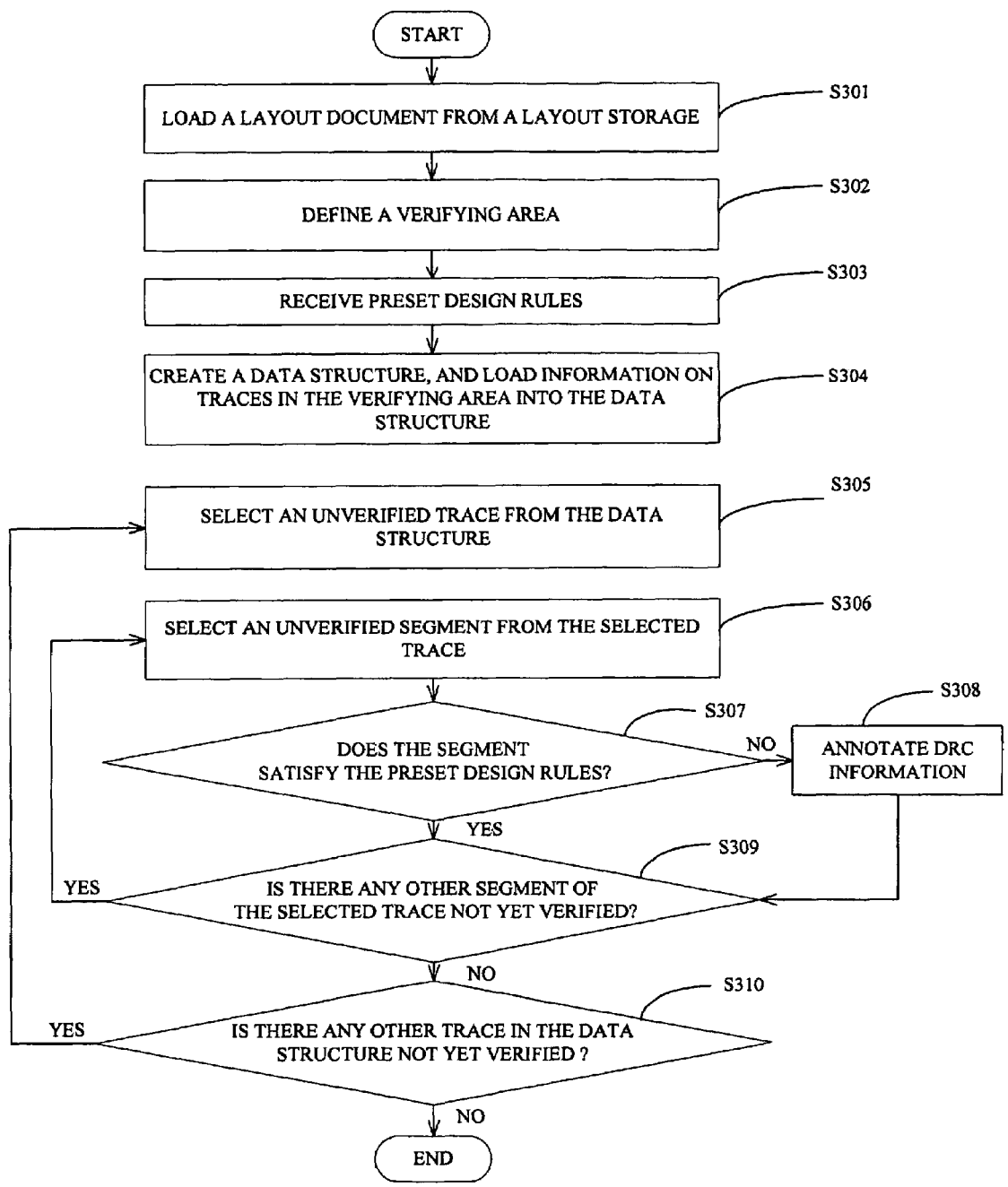
FIG. 3 is a flowchart of a preferred method for implementing the system of FIG. 1.

FIG. 3 is a flowchart of the preferred method for implementing the system. In step S301, the trace width verifying apparatus 1110 loads a PCB layout document from the layout storage 1320. In step S302, the trace width verifying apparatus 1110 defines a verifying area for the PCB layout specified in the PCB document (described in detail above in relation to FIG. 2). In step S303, the trace width verifying apparatus 1110 receives preset design rules from the rule storage 1310, in order to check whether widths of traces in the verifying area satisfy the preset design rules. In step S304, the trace width verifying apparatus 1110 creates a data structure, and loads information on the traces in the verifying area into the data structure. The data structure may be an array structure, or any other kind of data structure that can be implemented in the computer 1100. The information on the traces includes: trace IDs, trace names, trace types, segment IDs, start/end coordinates of segments, segment widths, and segment types. The segment type may be either a line or an arc. In step S305, the trace width verifying apparatus 1110 selects an unverified trace from the data structure based on a trace selection function, such as an Allegro™ selection function. Allegro is a PCB design software tool with a strong function library, and is available from Cadence Design Systems Inc. In step S306, the trace width verifying apparatus 1110 selects an unverified segment from the selected trace based on the segment selection function.

In step S307, the trace width verifying apparatus 1110 compares a segment width of the selected segment with the max-width and the min-width in the preset design rules, and determines whether the selected segment satisfies the preset design rules according to the comparison result. If the segment width of the selected segment is larger than the max-width or less than the min-width, in step S308, the trace width verifying apparatus 1110 regards the segment as unsatisfactory according to the preset design rules, and annotates DRC information to indicate that the selected segment does not satisfy the preset design rules. If the segment width of the selected segment is between the min-width and the max-width, in step S309, the trace width verifying apparatus 1110 regards the segment as satisfactory according to the preset design rules, and determines whether there is any other segment of the selected trace that has not been verified. If there is any other segment of the selected trace that has not been verified, the procedure returns to the step S306 described above. In contrast, if and when all segments of the selected trace have been verified, in step S310, the trace width verifying apparatus 1110 determines whether there is any other trace in the data structure that has not been verified. If there is any trace that has not been verified, the procedure returns to the step S305 described above. In contrast, if and when all the traces in the data structure have been verified, the procedure is ended.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for verifying trace widths of a printed circuit board (PCB) layout, the system comprising:
    a database for storing information on preset design rules and PCB layout documents; and
    a computer comprising a trace width verifying apparatus, the trace width verifying apparatus being for:
    loading a PCB layout document from the database;
    defining a basic rectangle in a PCB layout by selecting a pair of diagonal pins of a component of the PCB layout and then searching for another corresponding crossing pair of diagonal pins of the component;
    defining a verifying area for the PCB layout specified in the PCB document according to the basic rectangle;
    receiving preset design rules from the database;
    verifying traces in the verifying area one by one by checking whether segment widths of each trace satisfy the preset design rules; and
    annotating design rule check (DRC) information if any segment does not satisfy the preset design rules.

2. The system according to claim 1, wherein the trace width verifying apparatus further defines the verifying area by extending the basic rectangle in length and width to obtain a new larger rectangle according to a preset distance.

3. A computer-based method for verifying trace widths of a printed circuit board (PCB) layout, the method comprising the steps of:
    loading a PCB layout document from a database;
    defining a basic rectangle in a PCB layout by selecting a pair of diagonal pins of a component of the PCB layout and then searching for another corresponding crossing pair of diagonal pins of the component;
    defining a verifying area for the PCB layout specified in the PCB layout document according to the basic rectangle;
    receiving preset design rules;
    creating a data structure, and loading information on traces in the verifying area into the data structure;
    selecting an unverified trace from the data structure;
    selecting an unverified segment from the selected trace;

verifying the selected segment, by comparing a width of the selected segment with the preset design rules, and determining whether the selected segment satisfies the preset design rules according to the comparison result; and annotating design rule check (DRC) information if the segment width does not satisfy the preset design rules.

4. The method according to claim 3, further comprising the step of: returning to the step of selecting an unverified segment from the selected trace, if there is another segment in the selected trace that has not been verified after the selected segment has been verified.

5. The method according to claim 3, further comprising the step of: returning to the step of selecting an unverified trace from the data structure, if there is another trace in the data structure that has not been verified after the selected trace has been verified.

6. The method according to claim 3, wherein the DRC annotation indicates that the selected segment of the selected trace does not satisfy the preset design rules.

7. The method according to claim 3, wherein the verifying area is further defined by extending the basic rectangle in length and width to obtain a new larger rectangle according to a preset distance.

8. A method for verifying trace widths of a printed circuit board (PCB) layout, the method comprising the steps of:
retrieving information of said PCB layout;
defining a verifying area based on said information of said PCB layout, wherein said verifying area is defined by selecting at least two pins of a component of said PCB layout in order to use a line between said at least two pins as a diagonal of a rectangle so as to define said rectangle as said verifying area;
retrieving preset design rules about said trace widths of said PCB layout in said verifying area;
creating a data structure to organize said information of said PCB layout via said data structure;
verifying said trace widths of said PCB layout in said verifying area by comparing said information from said data structure with said preset design rules; and
reporting results of said verifying step.

* * * * *